United States Patent
Huang et al.

(10) Patent No.: US 11,314,612 B2
(45) Date of Patent: Apr. 26, 2022

(54) SYSTEM AND METHODS FOR INTELLIGENT FAN IDENTIFICATION INCLUDING FAN QUANTITY CHANGE DETECTING DURING POST

(71) Applicant: Dell Products, L.P., Round Rock, TX (US)

(72) Inventors: Ting-Chiang Huang, New Taipei (TW); Ying-Chi Ma, New Taipei (TW); Chen-Nan Cheng, New Taipei (TW); Tung-Ho Shih, Taipei (TW); Chien-Yi Juan, New Taipei (TW); Woei Xiong Soo, Taipei (TW); Ching-Lung Cheng, Taipei (TW); Sung-Feng Chen, Taipei (TW); Yo-Huang Chang, Taipei (TW)

(73) Assignee: Dell Products, L.P., Round Rock, TX (US)

( * ) Notice: Subject to any disclaimer, the term of this patent is extended or adjusted under 35 U.S.C. 154(b) by 140 days.

(21) Appl. No.: 16/868,649

(22) Filed: May 7, 2020

(65) Prior Publication Data
US 2021/0349800 A1   Nov. 11, 2021

(51) Int. Cl.
*G06F 11/22* (2006.01)
*G06F 11/30* (2006.01)
*H05K 7/20* (2006.01)

(52) U.S. Cl.
CPC ...... *G06F 11/3093* (2013.01); *G06F 11/2284* (2013.01); *G06F 11/2289* (2013.01); *H05K 7/20172* (2013.01)

(58) Field of Classification Search
CPC ............. G06F 11/2284; G06F 11/2289; G06F 11/3051; G06F 11/3093; H05K 7/20154; H05K 7/20172; F24F 11/49; H04W 4/025
See application file for complete search history.

(56) References Cited

U.S. PATENT DOCUMENTS

| 5,964,875 A | * | 10/1999 | Autor | ................. | G06F 11/2289 714/37 |
| 9,188,355 B1 | * | 11/2015 | Allen | ....................... | F24F 11/77 |
| 2012/0140402 A1 | * | 6/2012 | Mizumura | ......... | H05K 7/20836 361/679.33 |

(Continued)

OTHER PUBLICATIONS

Wikipedia's Embedded System historical version published May 6, 2020 https://en.wikipedia.org/w/index.php?title=Embedded_system &oldid=955191519 (Year: 2020).*

(Continued)

*Primary Examiner* — Joseph O Schell
(74) *Attorney, Agent, or Firm* — Fogarty LLP (57) ABSTRACT

Systems and methods for intelligent fan identification are described. In some embodiments, an Information Handling System (IHS) may include: an embedded controller (EC); and a memory coupled to the EC, the memory having program instructions stored thereon that, upon execution by the EC, cause the IHS to: detect a cooling fan configuration issue; determine that a number of cooling fans in the IHS has not changed between a previous configuration and a current configuration; and in response to the determination, abstain from identifying the cooling fan configuration issue as a cooling fan error.

18 Claims, 4 Drawing Sheets

(56) References Cited

U.S. PATENT DOCUMENTS

| | | | | |
|---|---|---|---|---|
| 2013/0138787 A1* | 5/2013 | Wang | ............... | H04L 41/04 |
| | | | | 709/223 |
| 2013/0158713 A1* | 6/2013 | Geissler | ............... | G05D 23/19 |
| | | | | 700/275 |
| 2015/0012139 A1* | 1/2015 | Hu | ............... | G06F 1/206 |
| | | | | 700/275 |
| 2015/0198957 A1* | 7/2015 | Montero | ............... | G06F 3/04847 |
| | | | | 700/300 |
| 2016/0183406 A1* | 6/2016 | Ragupathi | ............... | G05B 15/02 |
| | | | | 700/282 |
| 2017/0219239 A1* | 8/2017 | Lovicott | ............... | G06F 1/20 |
| 2018/0156225 A1* | 6/2018 | Izumi | ............... | F04D 25/06 |
| 2018/0310437 A1* | 10/2018 | Anderl | ............... | H05K 7/2019 |
| 2020/0315070 A1* | 10/2020 | Holland | ............... | F04D 27/00 |
| 2021/0029848 A1* | 1/2021 | Lin | ............... | G06F 1/20 |

OTHER PUBLICATIONS

Motherboard Port Guide: Solving Your Connector Mystery By Loyd Case published by PCWorld May 9, 2012 https://www.pcworld.com/article/464260/motherboard_port_guide_solving_your_connector_mystery.html (Year: 2012).*

Wikipedia's Flash Memory historical version published Apr. 18, 2020 https://en.wikipedia.org/w/index.php?title=Flash_memory&oldid=951657699 (Year: 2020).*

* cited by examiner

SYSTEM AND METHODS FOR INTELLIGENT FAN IDENTIFICATION INCLUDING FAN QUANTITY CHANGE DETECTING DURING POST

FIELD

This disclosure relates generally to Information Handling Systems (IHSs), and more specifically, to systems and methods for intelligent fan identification.

BACKGROUND

As the value and use of information continues to increase, individuals and businesses seek additional ways to process and store information. One option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

Often, IHSs are built with components having different cost and capabilities. For example, a typical IHS may support different numbers of processors with different clock speeds, different amounts of RAM, different storage devices, different power supplies, etc. Often, component pads and sockets are left unpopulated where an IHS has the capability to support a component but the component is not included in the current configuration.

Generally, in an IHS, an embedded controller (EC) monitors hardware devices by interfacing with them through general purpose input/output (GPIO) pins. In some instances, standardized communication links, such as I²C and SPI communications links, may provide logical interfaces. In other instances, dedicated GPIO pin interfaces provide direct communications between the EC and managed devices. For example, an EC may have a direct interface with a cooling fan pulse width modulation (PWM) output that commands cooling fan rotation speed and a second direct interface with a tachometer of the cooling fan to determine the cooling fan rotation speed. In various embodiments, the EC directly controls fan speed based upon thermal conditions at the IHS by sending PWM control signals to the cooling fan and reading tachometer signals provided from the cooling fan. In other embodiments, shared peripheral links, such as I²C or SPI links, may command cooling fan operations to a fan controller, with tachometer output provided through the fan controller or directly to the EC.

SUMMARY

Systems and methods for intelligent fan identification are described. In an illustrative, non-limiting embodiment, an Information Handling System (IHS) may include: an embedded controller (EC); and a memory coupled to the EC, the memory having program instructions stored thereon that, upon execution by the EC, cause the IHS to: detect a cooling fan configuration issue; determine that a number of cooling fans in the IHS has not changed between a previous configuration and a current configuration; and in response to the determination, abstain from identifying the cooling fan configuration issue as a cooling fan error.

To detect the cooling fan configuration issue, the program instructions, upon execution by the EC, may cause the IHS to identify a fan location mismatch. The cooling fan configuration issue may be detected in response to a cable being coupled between a fan and a non-corresponding connector on a printed circuit board (PCB). Additionally, or alternatively, the cooling fan configuration issue may be detected in response to a cable being coupled between the fan and a non-corresponding sensor.

The program instructions, upon execution by the EC, may cause the IHS to retrieve the previous configuration from a non-volatile memory (NVM) coupled to or integrated into the EC. The program instructions, upon execution by the EC, may further cause the IHS to, in response to a determination that a fan has been moved to a different fan slot, update a corresponding fan location on a fan table stored in the NVM. Moreover, the program instructions, upon execution by the EC, may also cause the IHS to, in response to a determination that a new fan has been added to the IHS, add the new fan and a corresponding fan location to a fan table stored in the NVM. In some cases, the determination may be part of a Power-On-Self-Test (POST) operation.

In another illustrative, non-limiting embodiment, a memory storage device may have program instructions stored thereon that, upon execution by an EC of an IHS, cause the IHS to: detect a cooling fan configuration issue; determine that a number of cooling fans in the IHS has not changed between a previous configuration and a current configuration; and in response to the determination, abstain from identifying the cooling fan configuration issue as a cooling fan error. In yet another illustrative, non-limiting embodiment, a method may include detecting a cooling fan configuration issue; determining that a number of cooling fans in the IHS has not changed between a previous configuration and a current configuration; and in response to the determination, abstaining from identifying the cooling fan configuration issue as a cooling fan error.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

For purposes of this disclosure, an Information Handling System (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory.

Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components.

Figure 1:
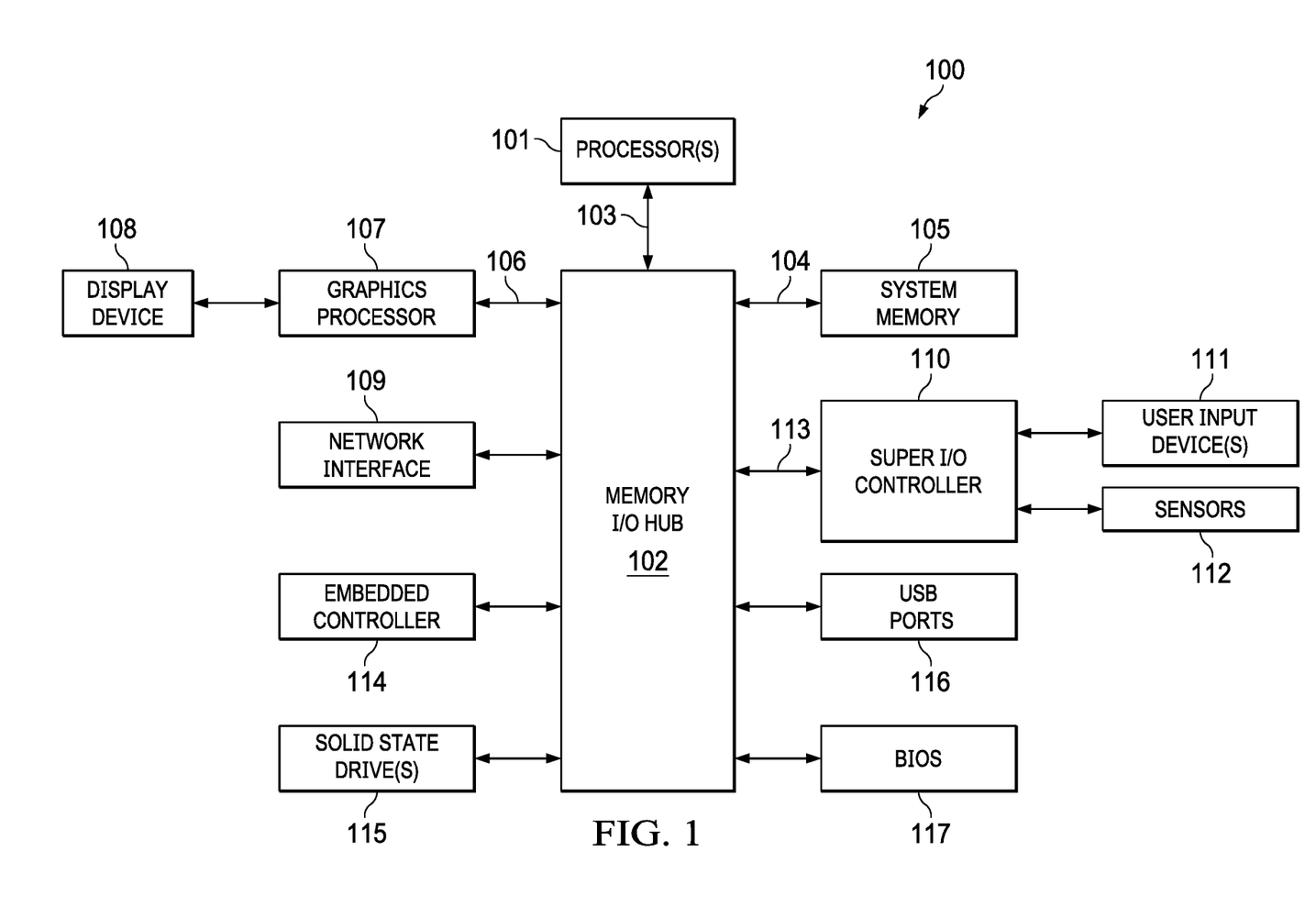
FIG. 1 is a block diagram illustrating an example of components of an Information Handling System (IHS), according to some embodiments.

FIG. 1 shows an example of components of IHS 100 configured to implement the systems and methods described herein according to certain embodiments. It should be appreciated that although certain implementations described herein are discussed in the context of a server computer or personal computer (e.g., laptop, desktop, tablet, etc.), other IHS implementations may be utilized.

Particularly, IHS 100 may include one or more processors 101. In various embodiments, IHS 100 may be a single-processor system including one processor 101, or a multi-processor system including two or more processors 101. Processor(s) 101 may include any processor capable of executing program instructions, such as an Intel Pentium™ series processor or any general-purpose or embedded processors implementing any of a variety of Instruction Set Architectures (ISAs), such as the x86, POWERPC®, ARM®, SPARC®, or MIPS® ISAs, or any other suitable ISA.

IHS 100 includes a memory I/O hub chipset 102 comprising one or more integrated circuits that connect to processor(s) 101 over a front-side bus 103. Memory I/O hub 102 provides the processor(s) 101 with access to a variety of resources. For instance, memory I/O hub 102 provides access to system memory 105 over memory bus 104. System memory 105 may be configured to store program instructions and/or data accessible by processors(s) 101. In various embodiments, system memory 105 may be implemented using any suitable memory technology, such as static RAM (SRAM), synchronous dynamic RAM (SDRAM), nonvolatile/Flash-type memory, or any other type of memory.

Memory I/O hub 102 may also provide access to graphics processor 107. In certain embodiments, graphics processor 107 may be comprised within one or more video or graphics cards that have been installed on IHS 100. Graphics processor 107 may be coupled to memory I/O hub 102 via graphics bus 106 such as provided an AGP (Accelerated Graphics Port) bus or a PCI (Peripheral Component Interconnect or) bus. In certain embodiments, graphics processor 107 generates display signals and provides them to coupled display device 108.

In certain embodiments, memory I/O hub 102 may also provide access to one or more user input devices 111. In such embodiments, memory I/O hub 102 may be coupled to a super I/O controller 110 that provides interfaces for variety of user input devices 111, in particular lower bandwidth and low data rate devices. For instance, super I/O controller 110 may provide access to a keyboard and mouse or other peripheral input devices. In certain embodiments, super I/O controller 110 may be used to interface with coupled user input devices 111 such as keypads, biometric scanning devices, and voice or optical recognition devices. In certain embodiments, super I/O controller 110 may also provide an interface for communication with one or more sensor devices 112, which may include environment sensors, such as a temperature sensor or other cooling system sensor. The I/O devices, such as user input devices 111 and sensor devices 112, may interface super I/O controller 110 through wired or wireless connections. In certain embodiments, super I/O controller 110 may be coupled via a Low Pin Count (LPC) bus 113.

Other resources may also be coupled to IHS 100 through memory I/O hub 102. In certain embodiments, memory I/O hub 102 may be coupled to network interface 109, such as provided by a Network Interface Controller (NIC). According to various embodiments, network interface 109 may support communication via various wired and/or wireless networks. Memory I/O hub 102 may also provide access to one or more hard disk and/or solid-state drives 115. Any or all of storage devices 115 may be integral to IHS 100, or may be located remotely from IHS 100. In certain embodiments, access may be provided to one or more Universal Serial Bus (USB) ports 116.

Another resource that may be accessed by processor(s) 101 via memory I/O hub 102 is BIOS 117. The BIOS 117 provides an abstraction layer for interfacing with certain hardware components that are utilized by IHS 100. Via this hardware abstraction layer provided by BIOS 117, the software executed by the processor(s) 101 of IHS is able to interface with certain I/O devices that are coupled to the IHS 100. The Unified Extensible Firmware Interface (UEFI) was designed as a successor to BIOS. As a result, many modern IHSs utilize UEFI in addition to or instead of a BIOS. As used herein, BIOS is intended to also encompass UEFI. Upon booting of the IHS 100, processor(s) 101 may utilize BIOS 117 instructions to initialize and test hardware components coupled to the IHS and to load an Operating System (OS) for use by IHS 100.

Sensors 112 may provide access to data describing environmental and operating conditions of IHS 100 (e.g., accelerometers, gyroscopes, hinge sensors, rotation sensors, hall effect sensors, lid sensors, temperature sensors, voltage sensors, current sensors, IR sensors, photosensors, proximity sensors, distance sensors, magnetic sensors, microphones, ultrasonic sensors, etc.).

Embedded Controller (EC) 114 may be coupled to processor 101 using SPI, eSPI, System Management Bus (SMBus), or shared interface techniques. Typically, EC 114 may be implemented as a microcontroller that handles tasks that the OS does not handle, such as receiving and processing signals from a keyboard, turning the IHS on and off, thermal measurement and response, controlling visual indicators, managing a battery, allowing remote diagnostics, service, and remediation, etc. In various embodiments, OS-to-EC Application Programming Interfaces (APIs) may be provided by EC 114 to the OS which allows the OS to make requests to EC 114 regarding various components of IHS 200.

Generally, EC 114 includes logic that manages thermal conditions at IHS 100, such as by monitoring processing component temperature readings and cooling fan operating conditions. In various embodiments, a cooling fan (not shown) may set a cooling fan rotation speed based thermal conditions detected at a processing component and communicated to a controller of the cooling fan, such as with PWM commands from EC 114 to the cooling fan.

If a cooling fan fails to provide expected cooling or fails completely, an error message is typically generated so that the end user knows to perform maintenance, such as replacing the cooling fan. In some instances, a cooling fan provides direct feedback to EC 114 that confirms its operation, such as by sending a tachometer output to a pin of EC 114, which counts rotations with a timer. EC 114 uses tachometer feedback to confirm operation of the cooling fan, such as by ensuring that detected fan speed matches commanded or expected fan speed.

In some implementations, IHS 100 may not include each of the components shown in FIG. 1. In other implementations, IHS 100 may include other components in addition to those that are shown in FIG. 1. Furthermore, some components that are represented as separate components in FIG. 1 may instead be integrated with other components. For example, all or a portion of the functionality provided by two or more discrete components may instead be provided by components that are integrated into processor(s) 100 as a systems-on-a-chip.

Figure 2:
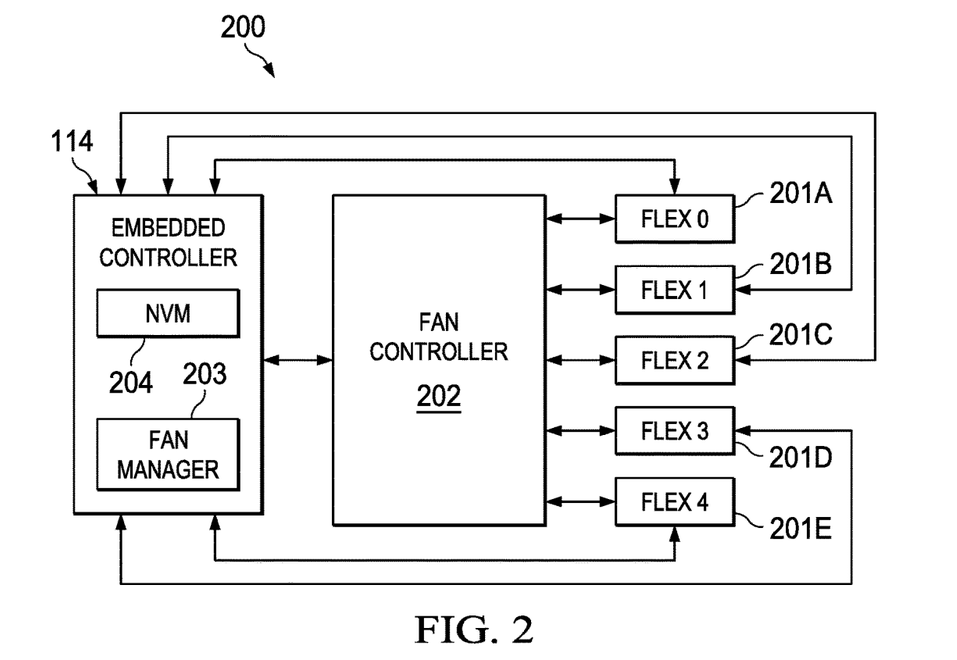
FIG. 2 is a block diagram depicting an example of embedded controller (EC) circuitry configured to perform intelligent fan identification, according to some embodiments.

FIG. 2 is a block diagram depicting an example of embedded controller (EC) circuitry 200 configured to perform intelligent fan identification. In various implementations, IHS 100 of FIG. 1 and/or components thereof (e.g., hard drives 15) may include fan slots ("flex") that accept cooling fans, such as may be needed due to power dissipation by the processing components. For example, a multiple cooling fans fan 26 may be installed and/or uninstalled if optional components are added to or removed from IHS 100.

In some embodiments, each cooling fan 201A-E interfaces with EC 114 to receive PWM commands to set the cooling fan speed and tachometer output to read the cooling fan speed that results from the PWM command. Cooling fan controller 202 may also be present to manage cooling fan operations, such as setting fan speeds with I²C commands from the cooling fan manager. Generally, each cooling fan 201A-E has at least one direct pin connection with embedded controller 114 so that cooling fan manager 203 can confirm cooling fan operations based upon instructions and/or information stored in non-volatile memory (NVM) 204. In some configurations, there may be a separate PWM and tachometer pin for each cooling fan 201A-E, however, various other types of interfaces may be used to support embedded controller interactions, such as a GPIO expander.

Cooling fan manager 203 commands cooling fan speeds with PWM pulses and then compares the commanded speed with feedback provided by a tachometer reading of the associated cooling fan. If a cooling fan 201A-E fails to provide feedback, or if the expected speed falls below a detectable tachometer reading, fan manager 203 issues an error. If the cooling fan is not present, an error is also issued.

However, in a conventional EC that is not configured to perform fan identification, if the service technician or end-user does not plug the fan cable and its temperature sensor or tachometer cable to the correct connectors, that EC also reports the configuration issue as an error, despite the fan and/or cable being otherwise operational. As a result, conventional ECs tend to over-report fan errors thereby significantly increasing the number of service calls as well as maintenance costs. Although this example describes problem(s) as related to a particular fan installation, in other embodiments, alternate hardware devices may present similar problem(s).

In contrast, using systems and methods described herein, EC 114 may be configured to perform a fan quantity checking operation to avoid false error alerts. In various embodiments, EC 114 may tolerant of mixed connections of cooling fan tables and temperature sensors.

Figure 3A:
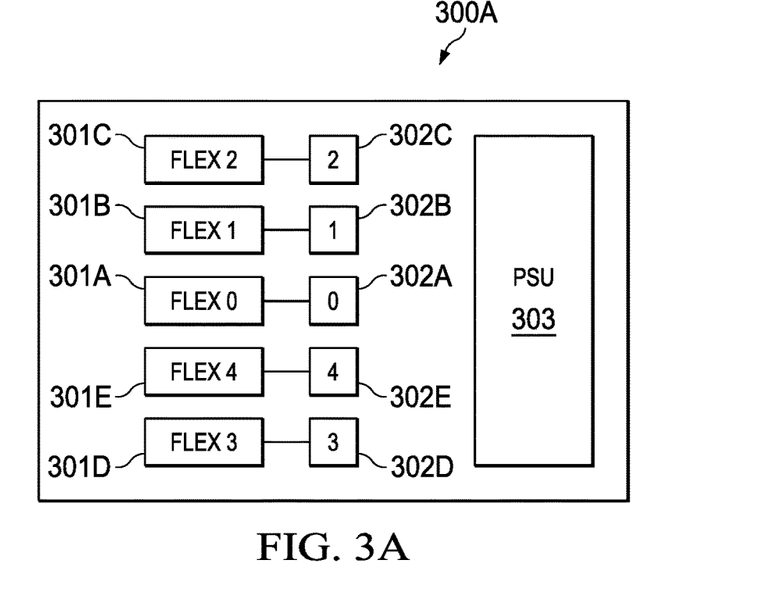
FIGS. 3A-C are block diagrams of examples of different cooling fan configurations, according to some embodiments.
Figure 3B:
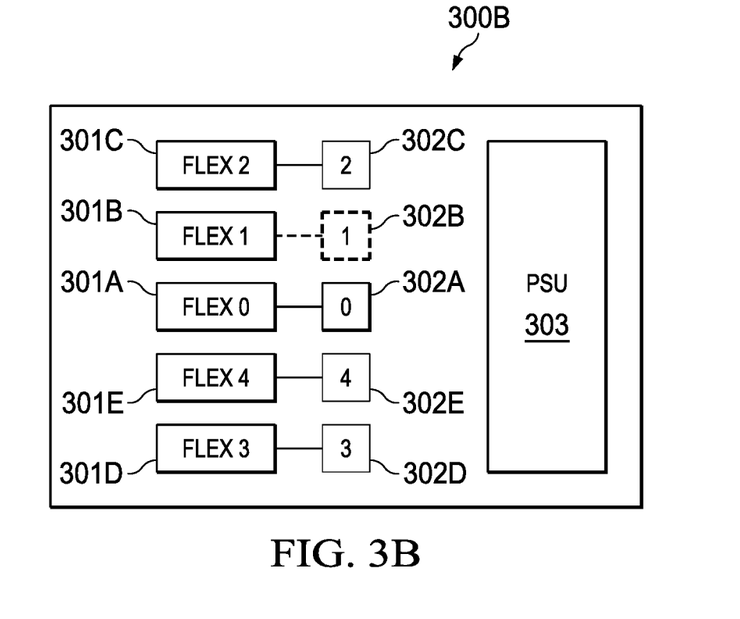
Figure 3C:
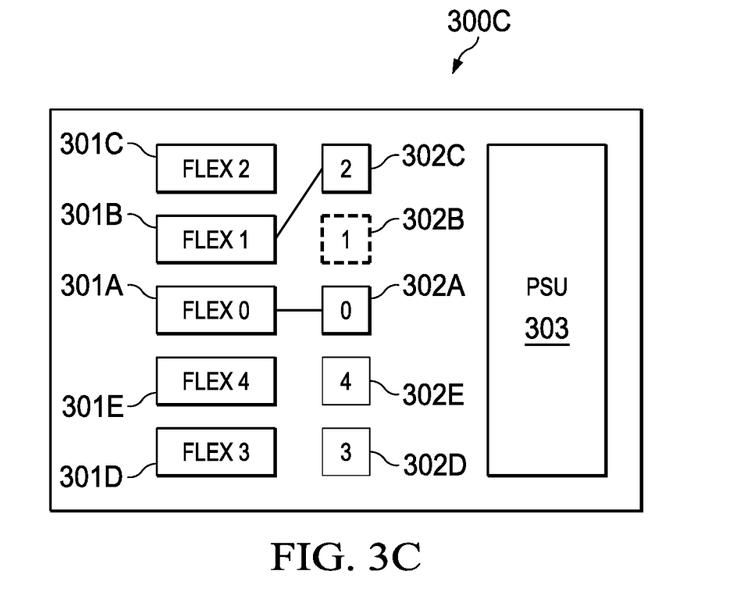

FIGS. 3A-C are block diagrams of examples of different cooling fan configurations 300A-C within a flex bay or modular fan component configured to be coupled to IHS 100. In various embodiments, any of flex slots 301A-E may be mounted on a printed circuit board (PCB) and populated with a respective cooling fan. Particularly, configuration 300A of FIG. 3A shows a default fan cable routing where flex bay 301A is coupled to connector 302A, flex bay 301B is coupled to connector 302B, flex bay 301C is coupled to connector 302C, flex bay 301D is coupled to connector 302D, and flex bay 301E is coupled to connector 302E using cables or wires. Power supply unit (PSU) 303 is configured to power each fan in each of flex slots 301A-E, if any.

In configuration 300BB of FIG. 3B, all 5 fans are present, but the fan inserted into flex slot 301B is damaged or its cable is inadvertently removed from flex bay 301B. In this error scenario, EC 114 may be configured to determine that fewer fans than expected are present in IHS 100, and it may issue an error message or flag.

In contrast, in configuration 300C of FIG. 3C, the fan in flex slot 301B is inadvertently coupled to connector 301C (instead of corresponding 301B). In this error scenario, EC 114 may be configured to determine that the expected number of fans matches the number of fans installed in IHS 100, and it may refrain from issuing an error message or flag. These, and other operations for intelligent fan identification performed by EC 114, are described in more detail below.

Figure 4:
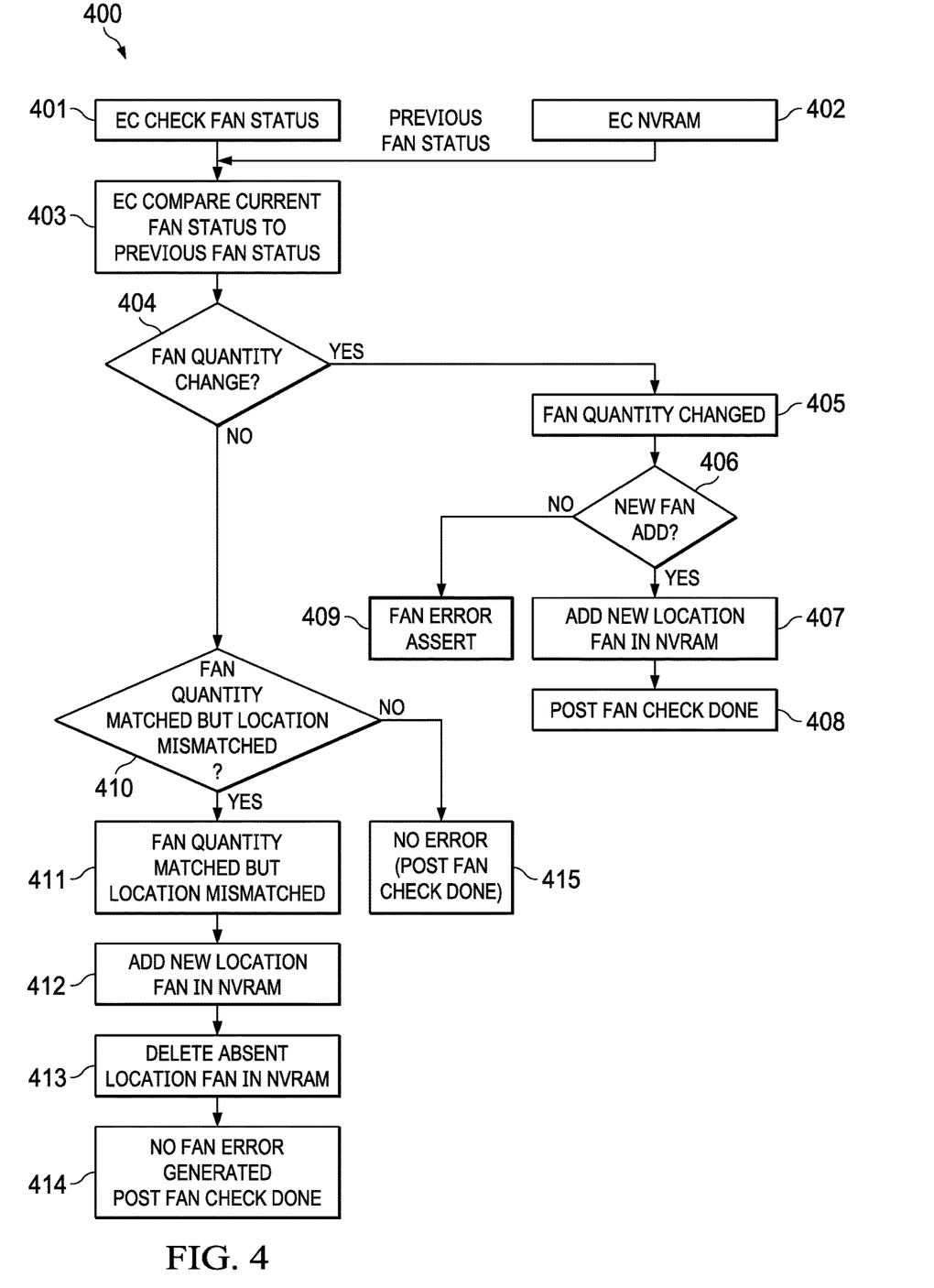
FIG. 4 is a flowchart of an example of a method for performing intelligent fan identification, according to some embodiments.

FIG. 4 is a flowchart of an example of a method for performing intelligent fan identification. Particularly, method 400 may be performed by fan manager 203 executing program instructions stored in NVM 204 of EC 114. In various embodiments, by executing method 400, EC 114 may create and maintain a fan quantity checking mechanism that avoids false error alerts and/or allows mixed plugging of cooling fan cables and temperature sensors using a common fan table design without over-heating risks.

At block 401, method 400 begins a fan status checking procedure, for example, as part of a Power-On-Self-Test (POST) operation. At block 402, NVM 204 provides a stored "previous fan status" message or information to fan manager 203. At block 403, method 400 compares a current fan status (e.g., number of fans installed, RPMs of each fan, temperature, etc.) to the previous fan status. At block 404, if the number or quantity of operational fans has changed, control passes to block 405. Otherwise, control passes to block 410.

At block 405, method 400 determines that the number of operational fans has changed and/or there is a fan location mismatch, therefore identifying a cooling fan configuration issue. If at block 406, it is determined that a new fan was added to IHS 100, block 407 adds a new location of the fan in NVM 204, and block 408 finishes the fan checking portion of the POST operation (performed by BIOS 117 upon booting of IHS 100). Otherwise, if the quantity of fans has changed but no new fan has been added (that is, a fan was removed), block 409 asserts a fan error flag or message indicative of a cooling fan error.

Returning to block 410, if the number of fans has not changed, block 411 determines that the current fan quantity matches the previous quantity, but the location of at least one fan is mismatched with its expected or stored location. Accordingly, at block 412, method 400 may store a new location of a fan present in IHS 100 in NVM 204, block 413 may delete the location of a fan absent from IHS 100 from NVM 204, for example, by updating a fan table. Then, at block 414, method 400 may end the POST operation without having generated a fan error message or flag, thus abstaining from identifying the original cooling fan configuration issue as an actual cooling fan error.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An Information Handling System (IHS), comprising:
an embedded controller (EC); and
a memory coupled to the EC, the memory having program instructions stored thereon that, upon execution by the EC, cause the IHS to:
  detect a cooling fan configuration issue;
  determine, as part of a Power-On-Self-Test (POST) operation, that a number of cooling fans in the IHS has not changed between a previous configuration and a current configuration; and
  in response to the determination, abstain from identifying the cooling fan configuration issue as a cooling fan error.

2. The IHS of claim 1, wherein to detect the cooling fan configuration issue, the program instructions, upon execution by the EC, cause the IHS to identify a fan location mismatch.

3. The IHS of claim 2, wherein the cooling fan configuration issue is detected in response to a cable coupled between a fan and a non-corresponding connector on a printed circuit board (PCB).

4. The IHS of claim 3, wherein the cooling fan configuration issue is detected in response to a cable coupled between the fan and a non-corresponding sensor.

5. The IHS of claim 1, wherein the program instructions, upon execution by the EC, cause the IHS to retrieve the previous configuration from a non-volatile memory (NVM) coupled to or integrated into the EC.

6. The IHS of claim 5, wherein the program instructions, upon execution by the EC, cause the IHS to, in response to a determination that a fan is moved to a different fan slot, update a corresponding fan location on a fan table stored in the NVM.

7. The IHS of claim 5, wherein the program instructions, upon execution by the EC, cause the IHS to, in response to a determination that a new fan is added to the IHS, add the new fan and a corresponding fan location to a fan table stored in the NVM.

8. A memory storage device having program instructions stored thereon that, upon execution by an embedded controller (EC) of an Information Handling System (IHS), cause the IHS to:
  detect a cooling fan configuration issue;
  determine, as part of a Power-On-Self-Test (POST) operation, that a number of cooling fans in the IHS has not changed between a previous configuration and a current configuration; and
  in response to the determination, abstain from identifying the cooling fan configuration issue as a cooling fan error.

9. The memory storage device of claim 8, wherein to detect the cooling fan configuration issue, the program instructions, upon execution by the EC, cause the IHS to identify a fan location mismatch.

10. The memory storage device of claim 9, wherein the cooling fan configuration issue is detected in response to a cable coupled between a fan and a non-corresponding connector on a printed circuit board (PCB).

11. The memory storage device of claim 10, wherein the cooling fan configuration issue is detected in response to a cable coupled between the fan and a non-corresponding sensor.

12. The memory storage device of claim 8, wherein the program instructions, upon execution by the EC, cause the IHS to retrieve the previous configuration from a non-volatile memory (NVM) coupled to or integrated into the EC.

13. The memory storage device of claim 12, wherein the program instructions, upon execution by the EC, cause the IHS to, in response to another determination that a fan is moved to a different fan slot, update a corresponding fan location on a fan table stored in the NVM.

14. The memory storage device of claim 13, wherein the program instructions, upon execution by the EC, cause the IHS to, in response to another determination that a new fan is added to the IHS, add the new fan and a corresponding fan location to a fan table stored in the NVM.

15. A method, comprising:
   detecting a cooling fan configuration issue;
   determining, as part of a Power-On-Self-Test (POST) operation, that a number of cooling fans in the IHS has not changed between a previous configuration and a current configuration; and
   in response to the determination, abstaining from identifying the cooling fan configuration issue as a cooling fan error.

16. The method of claim 15, further comprising retrieving the previous configuration from a non-volatile memory (NVM) of an embedded controller (EC) coupled to an Information Handling System (IHS).

17. The method of claim 16, further comprising, in response to another determination that a fan has been moved to a different fan slot, updating a corresponding fan location on a fan table stored in the NVM.

18. The method of claim 16, further comprising, in response to another determination that a new fan has been added to the IHS, adding the new fan and a corresponding fan location to a fan table stored in the NVM.

* * * * *